(12) United States Patent
Unger et al.

(10) Patent No.: US 11,127,880 B2
(45) Date of Patent: Sep. 21, 2021

(54) OPTOELECTRONIC SEMICONDUCTOR DEVICE AND METHOD FOR PRODUCING AN OPTOELECTRONIC SEMICONDUCTOR DEVICE

(71) Applicant: OSRAM Opto Semiconductors GmbH, Regensburg (DE)

(72) Inventors: Johannes Unger, Regensburg (DE); Franz Eberhard, Regensburg (DE); Fabian Kopp, Penang (MY); Katharina Christoph, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/409,472

(22) Filed: May 10, 2019

(65) Prior Publication Data

US 2019/0355869 A1   Nov. 21, 2019

(30) Foreign Application Priority Data

May 17, 2018   (DE) .......................... 102018111889.9

(51) Int. Cl.
| | | |
|---|---|---|
| *H01L 33/44* | (2010.01) | |
| *H01L 33/08* | (2010.01) | |
| *H01L 33/26* | (2010.01) | |
| *H01L 33/00* | (2010.01) | |

(52) U.S. Cl.
CPC ............ *H01L 33/08* (2013.01); *H01L 33/007* (2013.01); *H01L 33/26* (2013.01)

(58) Field of Classification Search
CPC .......... H01L 33/40; H01L 33/44; H01L 33/08
See application file for complete search history.

(56) References Cited

U.S. PATENT DOCUMENTS

| | | | |
|---|---|---|---|
| 6,573,537 B1 | 6/2003 | Steigerwald et al. | |
| 2005/0045978 A1* | 3/2005 | Zoelfl | ................... H01L 33/145 |
| | | | 257/428 |
| 2005/0087755 A1* | 4/2005 | Kim | ........................ H01L 33/32 |
| | | | 257/98 |
| 2006/0073692 A1* | 4/2006 | Yoshida | .................. H01L 24/03 |
| | | | 438/605 |

(Continued)

FOREIGN PATENT DOCUMENTS

| | | |
|---|---|---|
| DE | 10213701 A1 | 10/2002 |
| DE | 10329398 A1 | 2/2005 |

*Primary Examiner* — Michele Fan
(74) *Attorney, Agent, or Firm* — Slater Matsil, LLP

(57) ABSTRACT

An optoelectronic semiconductor device and a method for producing an optoelectronic semiconductor device are disclosed. In an embodiment an optoelectronic semiconductor device includes a semiconductor body having a first region of a first conductivity type, an active region configured to generate electromagnetic radiation and a second region of a second conductivity type in a stacking direction, an electrical contact metallization arranged on a side of the second region facing away from the active region and being opaque to the electromagnetic radiation, a radiation coupling-out region surrounding the electrical contact metallization at an edge side and an absorber layer structure arranged between the electrical contact metallization and the second region.

13 Claims, 6 Drawing Sheets

(56) References Cited

U.S. PATENT DOCUMENTS

| | | | |
|---|---|---|---|
| 2010/0320447 A1* | 12/2010 | Chen | H01L 51/5088 |
| | | | 257/40 |
| 2011/0031472 A1 | 2/2011 | Tang et al. | |
| 2014/0034976 A1* | 2/2014 | Chu | H01L 27/153 |
| | | | 257/93 |
| 2014/0264411 A1* | 9/2014 | Lin | H01L 33/20 |
| | | | 257/98 |
| 2014/0346553 A1* | 11/2014 | Bernhardt | H01L 33/06 |
| | | | 257/99 |
| 2016/0172560 A1 | 6/2016 | Chen et al. | |

* cited by examiner

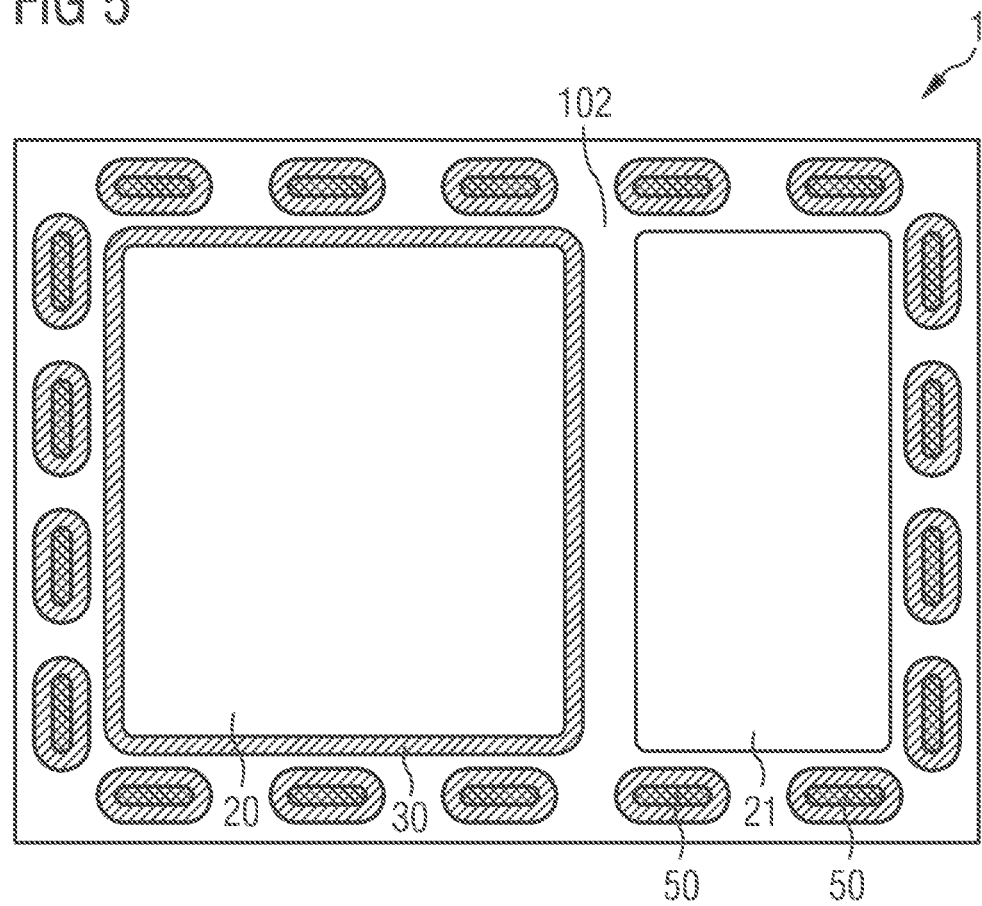

OPTOELECTRONIC SEMICONDUCTOR DEVICE AND METHOD FOR PRODUCING AN OPTOELECTRONIC SEMICONDUCTOR DEVICE

CROSS-REFERENCE TO RELATED APPLICATIONS

This application claims the priority of German patent application 102018111889.9, filed on May 17, 2018, which application is hereby incorporated herein by reference.

TECHNICAL FIELD

An optoelectronic semiconductor device and a method for producing an optoelectronic semiconductor device are specified. An optoelectronic semiconductor device can be a radiation-emitting optoelectronic semiconductor device that emits electromagnetic radiation, such as light, during operation.

SUMMARY

Embodiments provide an optoelectronic semiconductor device which has a reduced brightness.

Further embodiments provide a method for producing an optoelectronic semiconductor device that enables a simplified production.

In accordance with at least one embodiment of the optoelectronic semiconductor device, the optoelectronic semiconductor device comprises, in a stacking direction, a semiconductor body having a first region of a first conductivity type, an active region designed to generate electromagnetic radiation, and a second region of a second conductivity type. The regions of the semiconductor body are particularly epitaxially grown on a growth substrate in the stacking direction mentioned above.

The active region is arranged between the first region and the second region in a plane parallel to a main extension plane of the semiconductor body and preferably comprises a pn junction, a double heterostructure, a single quantum well (SQW) or, most preferably, a multi quantum well (MQW) for radiation generation. The stacking direction is transverse, preferably perpendicular, to the main extension plane of the semiconductor body.

The first conductivity type is in particular an n-conductivity type, which is formed, for example, by doping with an n-conducting material. The second conductivity type is in particular a p-conducting type, which is formed, for example, by doping with a p-conducting material.

According to at least one embodiment, the optoelectronic semiconductor device comprises an electrical contact metallization arranged on the side of the second region facing away from the active region, which is opaque to the electromagnetic radiation. The contact metallization is used in particular for electrical contacting of the second semiconductor region and is formed with a metal or a metal alloy. In particular, the contact metallization contains at least one of the following metals: titanium, platinum, gold.

According to at least one embodiment of the optoelectronic semiconductor device, the optoelectronic semiconductor device comprises a radiation coupling-out region along the edge of the contact metallization. The radiation coupling-out region serves for coupling-out at least part of the electromagnetic radiation, which is generated in the active region. The degree of the electromagnetic radiation generated in the active region, which is coupled out, is determined, among other things, by the spatial extent of the radiation coupling-out region. A small spatial expansion of the radiation coupling-out surface reduces the degree of radiation, which is coupled out, and thus the overall brightness of the optoelectronic semiconductor device.

According to at least one embodiment of the optoelectronic semiconductor device, an absorber layer structure is arranged between the electrical contact metallization and the second region. The absorber layer structure may have only one absorber layer or be composed of several absorber layers, preferably of different materials. The absorber layer structure is designed to absorb electromagnetic radiation generated in the active region and is preferably formed with a metal or metal alloy.

The contact metallization reflects electromagnetic radiation from the semiconductor body back into the semiconductor body. In other words, the electromagnetic radiation passes through the absorber layer structure and is thereby attenuated. The electromagnetic radiation is then reflected by the contact metallization and again passes through the absorber layer structure, where the electromagnetic radiation is again attenuated. In addition, part of the electromagnetic radiation is reflected back from the absorber layer structure itself into the semiconductor body.

According to at least one embodiment, the optoelectronic semiconductor device comprises a semiconductor body having, in a stacking direction, a first region of a first conductivity type, an active region designed to generate electromagnetic radiation, and a second region of a second conductivity type, an electrical contact metallization which is arranged on the side of the second region facing away from the active region and is opaque to the electromagnetic radiation, a radiation coupling-out region which surrounds the electrical contact metallization at the edge side and an absorber layer structure disposed between the electrical contact metallization and the second region.

An optoelectronic semiconductor device described herein is based, among other things, on the following considerations: In many applications, for example, in the automotive industry, a constant brightness of optoelectronic semiconductor devices with unchanged electrical operating parameters over a period of several years is of importance. Due to technological advances in the production of the light-generating active regions and the semiconductor body, further improvements in the efficiency of optoelectronic semiconductor devices are constantly being achieved. In order to keep the brightness of an optoelectronic semiconductor device constant with unchanged electrical operating parameters, it is desirable to set the brightness to a desired value without changing the electrical operating parameters.

The optoelectronic semiconductor device described herein makes use, among other things, of the idea of absorbing part of the light generated in the active region through a comparatively large area of the contact metallization and an absorber layer structure introduced between the semiconductor body and the contact metallization. This allows a constant brightness of the optoelectronic semiconductor device to be guaranteed with constant electrical operating parameters, even if the light generation in the active region has been increased.

According to at least one embodiment of the optoelectronic semiconductor device, at least one layer of the absorber layer structure is formed with gold. In particular, gold has a high absorption coefficient for light in a green and a blue spectral range.

According to at least one embodiment of the optoelectronic semiconductor device, the thickness of the layer formed with gold in the absorber layer structure is at most 500 nm. The preferred thickness of the layer formed with gold in the absorber layer structure is in the range from 30 nm to 300 nm and particularly preferred in the range from 100 nm to 200 nm. For range specifications, the limits are included here and in the following.

According to at least one embodiment of the optoelectronic semiconductor device, at least one layer of the absorber layer structure is formed with palladium and/or nickel. Palladium and nickel provide an advantageously good electrical contact and good mechanical adhesion between a metallic layer and a semiconductor layer formed, for example, with a gallium nitride.

According to at least one embodiment of the optoelectronic semiconductor device, the thickness of the layer formed with palladium and/or nickel in the absorber layer structure lies within a range from 0.5 nm to 100 nm. The preferred thickness of the layer formed with palladium or nickel in the absorber layer structure is in the range from 2 nm to 20 nm and particularly preferred in the range from 3 nm to 10 nm. The thickness of the layer formed with palladium and/or nickel determines the absorption effect of the gold layer above. The thicker the layer formed with palladium and/or nickel, the lower the absorption effect of the gold layer above.

According to at least one embodiment of the optoelectronic semiconductor device, the semiconductor body is based on a nitride compound semiconductor material.

"Based on nitride compound semiconductors" in the present context means that the active epitaxy layer sequence or at least one layer thereof comprises a nitride III/V compound semiconductor material, preferably $Al_nGa_mIn_{1-n-m}N$, wherein $0 \leq n \leq 1$, $0 \leq m \leq 1$ and $n+m \leq 1$. Thereby, this material does not necessarily have to have a mathematically exact composition according to the above formula. Rather, it may contain one or more dopants and additional components that essentially do not alter the characteristic physical properties of the $Al_nGa_mIn_{1-n-m}N$ material. For simplicity's sake, however, the above formula contains only the essential components of the crystal lattice (Al, Ga, In, N), even if these may be partially replaced by small amounts of other substances. In the case of a semiconductor body based on a nitride compound semiconductor, a p-type conductor is further preferred formed by doping with magnesium and/or an n-type conductor is formed by doping with silicon.

According to at least one embodiment of the optoelectronic semiconductor device, an adhesive layer is arranged between the absorber layer structure and the electrical contact metallization, which adhesive layer is preferably formed with titanium, chromium, nickel, tungsten and/or ITO (indium tin oxide). In particular, the adhesive layer improves the mechanical adhesion of the absorber layer structure to the contact metallization.

According to at least one embodiment of the optoelectronic semiconductor device, the electrical contact metallization occupies an area portion of at least 20% of the area of the semiconductor body. The area of the semiconductor body is the radiation-side surface of the semiconductor body, in particular the maximum area available for coupling-out radiation without contact metallization. Preferably, the electrical contact metallization takes up at least 40% of the surface area of the semiconductor body and especially at least 60%. Since the contact metallization is opaque for the electromagnetic radiation from the active region, an increased surface area of the electrical contact metallization results in a greater shadowing of the electromagnetic radiation. In other words, the degree of electromagnetic radiation coupled out from the semiconductor body decreases with an increased surface area of the contact metallization.

According to at least one embodiment of the optoelectronic semiconductor device, a distance of the absorber layer structure to a side surface of the semiconductor body lies within the range of 0.1 µm to 15 µm. The preferred distance between the absorber layer structure and a side surface of the semiconductor body lies within the range from 0.5 µm to 9 µm and particularly preferred within the range from 1 µm to 3 µm. The side surface of the semiconductor body extends along and in particular parallel to the stacking direction of the semiconductor body and is thus arranged transversely, preferably perpendicular to the main plane of extension of the semiconductor body.

According to at least one embodiment of the optoelectronic semiconductor body, a trench is formed in the semiconductor body, starting from the side of the second region facing away from the active region, contrary to the stacking direction, which trench at least partially surrounds the radiation coupling-out region. A trench surrounding the radiation coupling-out region advantageously reduces the coupling-out of electromagnetic radiation at the side surfaces of the optoelectronic semiconductor device.

According to at least one embodiment of the optoelectronic semiconductor device, the trench penetrates at least half of the semiconductor body in the stacking direction. In other words, the depth of the trench is at least half the thickness of the semiconductor body. The trench preferentially penetrates at least two thirds of the semiconductor body in the stacking direction and the trench particularly preferentially penetrates the semiconductor body completely in the stacking direction, for example, up to a growth substrate or carrier to which the semiconductor body is applied. As the depth of the trench increases, the electromagnetic radiation coupled-out to the side surfaces of the optoelectronic semiconductor device is advantageously reduced.

According to at least one embodiment of the optoelectronic semiconductor device, the length of the trench is at least 10% of the circumference of the radiation coupling-out region. In case of doubt, the circumference of the radiation coupling-out region is understood to be the circumference along a lateral boundary of the radiation coupling-out region on a side facing away from the contact metallization. In case of doubt, the length of the trench should be measured along the middle of the trench. The preferred length of the trench is at least 50% of the circumference of the radiation coupling-out area. The trench can also have several sections whose lengths add up accordingly. Furthermore, the trench preferentially surrounds the radiation coupling-out area completely. A completely circumferential, closed trench at the edge largely or even completely prevents an undesired coupling-out of electromagnetic radiation at the side surfaces of the optoelectronic semiconductor device. Furthermore, a completely circumferential, closed trench in particular also acts as an ESD protection, i.e., as protection against electrostatic discharges.

According to at least one embodiment of the optoelectronic semiconductor device, the trench is at least partially filled with a light-absorbing material. A light-absorbing material can be a metal such as palladium or gold, for example, or a polymer into which light-absorbing particles can be incorporated. Preferably, the light-absorbing material corresponds to the material of the electrical contact metallization. The arrangement of light-absorbing material in the trench allows an advantageously high absorption of electromagnetic radiation generated in the active region.

According to at least one embodiment of the optoelectronic semiconductor device, the side edges of the trench include a flank angle of less than 70°, preferably of less than 60°, and particularly preferably of less than 50° with the main plane of extension of the semiconductor body. A flank angle of the trench as small as possible reduces the intensity of electromagnetic radiation emitted from the side surfaces of the trench.

In addition, a method for producing an optoelectronic semiconductor device is specified. In particular, the method can be used to produce an optoelectronic semiconductor device described herein. This means that all features disclosed for the optoelectronic semiconductor device are also disclosed for the method and vice versa.

According to at least one embodiment of a method for producing an optoelectronic semiconductor device, the method comprises the following steps:

Providing a semiconductor body having, in the stacking direction, a first region of a first conductivity type, an active region designed to emit electromagnetic radiation, and a second region of a second conductivity type. Furthermore, an absorber layer structure is arranged on the side of the second region facing away from the active region. The regions of the semiconductor body have grown epitaxially. The deposition of the absorber layer structure takes place, for example, by sputtering, PVD (physical vapor deposition) or a CVD (chemical vapor deposition) method.

According to at least one embodiment of the method for producing an optoelectronic semiconductor device, a first mask layer, which has at least one recess, is applied to the side of the absorber layer structure facing away from the semiconductor body. The first mask layer, for example, is formed from a photoresist or a non-conductive polymer.

According to at least one embodiment of the method for producing an optoelectronic semiconductor device, at least one etching process for producing at least one recess in the semiconductor body is carried out, wherein both material of the absorber layer structure and material of the semiconductor body are removed within the recess in the first mask layer. In this method a deliberate undercutting of the first mask layer can occur.

According to at least one embodiment of the method for producing an optoelectronic semiconductor device, a first etching process is carried out, wherein material of the absorber layer structure is removed within the recesses in the first mask layer. This first etching process is carried out, for example, wet-chemically and produces an undercut of the first mask layer.

According to at least one embodiment of the method for producing an optoelectronic semiconductor device, a second etching process is carried out to produce at least one recess in the semiconductor body. This second etching process is preferably carried out after the first etching process. The second etching process is preferably carried out dry chemically and, like the first etching process, uses the first mask layer. This allows self-aligned mounting of the absorber layer structure relative to the recess. The absorber layer structure is retracted laterally by a certain distance from the recess in the first mask layer, forming a defined distance of the absorber layer structure from the peripheral side surface of the semiconductor body formed by the recess in the semiconductor body.

According to at least one embodiment of the method for producing an optoelectronic semiconductor device, the first mask layer is removed in a further step. For example, the first mask layer is optically non-transparent, which would impede the radiation coupling-out of the optoelectronic semiconductor device.

According to at least one embodiment of the method for producing an optoelectronic semiconductor device, an electrical contact metallization is applied to the side of the absorber layer structure facing away from the semiconductor body in a further step.

According to at least one embodiment of the method for producing an optoelectronic semiconductor device, in a further step, preferably after removing the first mask layer, a second mask layer having at least one recess is applied to the side of the absorber layer structure facing away from the semiconductor body, wherein the recess in the second mask layer overlaps at least partially with the absorber layer structure. The recess in the second mask layer is filled with the material of the electrical contact metallization. The second mask layer serves to structure the subsequent contact metallization and is formed, for example, from a photoresist or a non-conductive polymer.

In various embodiments, an optoelectronic semiconductor device described here can be advantageously produced in only two planes using the method described herein for producing by using only two different mask layers.

BRIEF DESCRIPTION OF THE DRAWINGS

Further advantages and advantageous designs and further embodiments of the optoelectronic semiconductor device result from the following exemplary embodiments in connection with the figures.

Showing:

FIG. 5 is a schematic top view of an optoelectronic semiconductor device according to a third exemplary embodiment.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

DETAILED DESCRIPTION OF ILLUSTRATIVE EMBODIMENTS

Figure 1A:
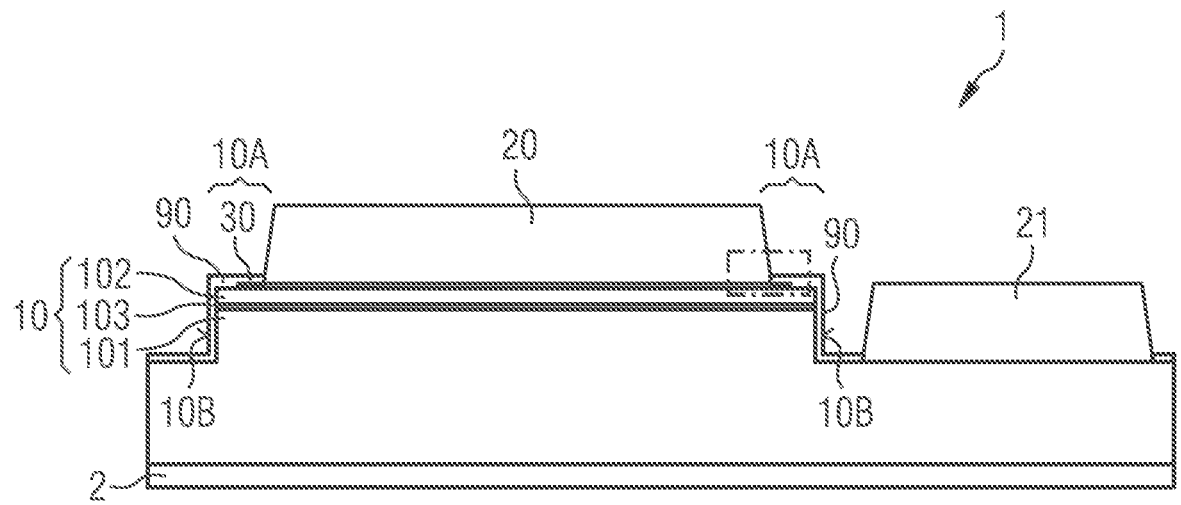
FIG. 1A is a schematic cross-section of an optoelectronic semiconductor device according to a first exemplary embodiment.

FIG. 1A shows a schematic cross-section of an optoelectronic semiconductor device 1 described herein, according to the first exemplary embodiment. The represented optoelectronic semiconductor device 1 comprises a semiconductor body 10 having a first region 101 of a first conductivity type, a second region 102 of a second conductivity type, and an active region 103 designed for generating electromagnetic radiation.

The regions of the semiconductor body 10 are especially epitaxially grown on a growth substrate 2. Furthermore, the semiconductor body 10 can also be detached from a growth substrate after epitaxial growth and applied to a carrier. Passivation 90 and contact metallization 20 are applied to the semiconductor body 10. Passivation 90, for example, is formed from silicon oxide or silicon oxynitride. Contact metallization 20 is used for electrical contacting of the second region 102 and is opaque to the electromagnetic radiation generated in the active region 103.

An absorber layer structure 30 is arranged between the contact metallization 20 and the side of the second region 102 facing away from the active region 103. The absorber layer structure 30 comprises several layers of different materials and, in particular, has a high optical absorption coefficient for the electromagnetic radiation generated in the active region 103. A radiation coupling-out region 10A, which is provided for coupling-out at least part of the electromagnetic radiation generated in the active region 103, is arranged on the edge side along the contact metallization 20. The larger the overlap of the absorber layer structure 30 with the radiation coupling-out region 10A, the smaller the coupling-out efficiency of the optoelectronic semiconductor device 1.

Laterally spaced apart from the contact metallization 20, an electrical connection layer 21 is arranged, which is provided for electrical contacting of the first region 101. The lateral expansion of the semiconductor body 10 is limited by a side surface of the semiconductor body 10B. The region of the optoelectronic semiconductor device 1 surrounded by a dotted line is shown in FIG. 1B in an enlarged image.

Figure 1B:
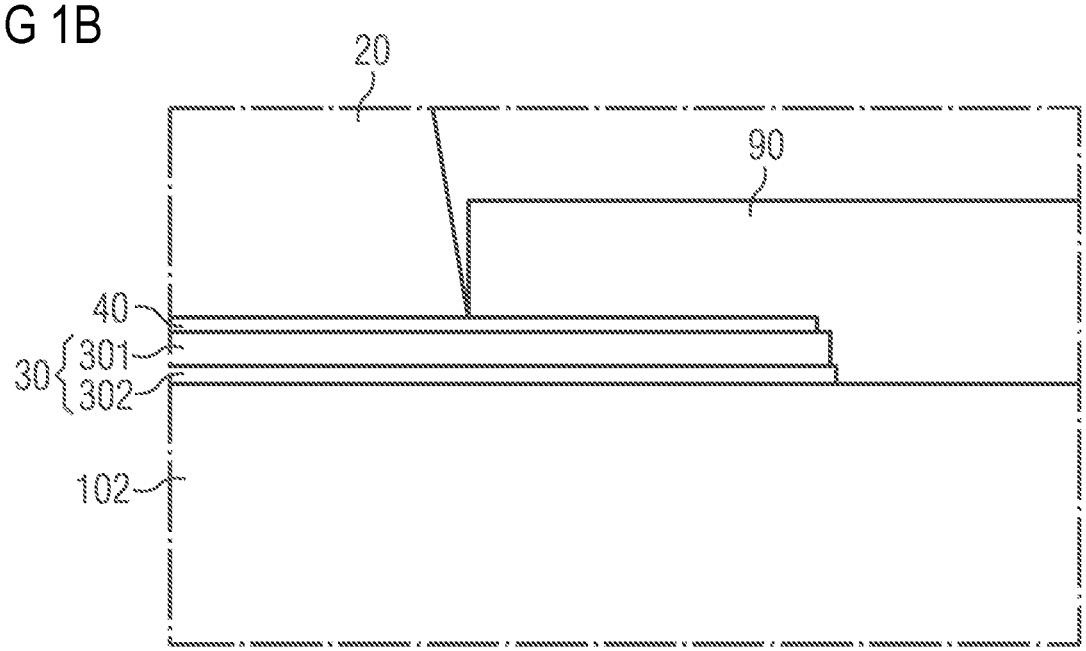
FIG. 1B is a section of a schematic cross-section of an optoelectronic semiconductor device according to the first exemplary embodiment.

FIG. 1B shows a section of a schematic cross-section of an optoelectronic semiconductor device 1 described herein, according to the first exemplary embodiment. The section shown herein corresponds to the region of the optoelectronic semiconductor device 1 outlined by a dotted line in FIG. 1A. Herein illustrated is a detailed view of the absorber layer structure 30 comprising a layer formed with gold 301 and a layer formed with palladium or nickel 302. The layer formed with gold 301 shows in particular a high absorption coefficient for electromagnetic radiation in a green and a blue spectral range. The layer formed with palladium or nickel 302 is reflective and partially transparent to the electromagnetic radiation generated in the active region 103. The thickness of the layer formed with palladium or nickel 302 thus determines the absorptive effect of the layer formed with gold 301 above it. A thicker layer formed with palladium or nickel 302 reduces the absorptive effect of the layer formed with gold 301, whereas a thinner layer formed with palladium or nickel 302 increases the absorptive effect of the layer formed with gold 301.

An adhesive layer 40 is applied to the absorber layer structure 30, which is formed, for example, from titanium. The adhesive layer 40 improves the mechanical adhesion of the contact metallization 20 on the absorber layer structure 30. For shielding against external environmental influences, a passivation layer 90 made of silicon oxide is arranged above the absorber layer structure 30 and the material of the second region 102.

Figure 2A:
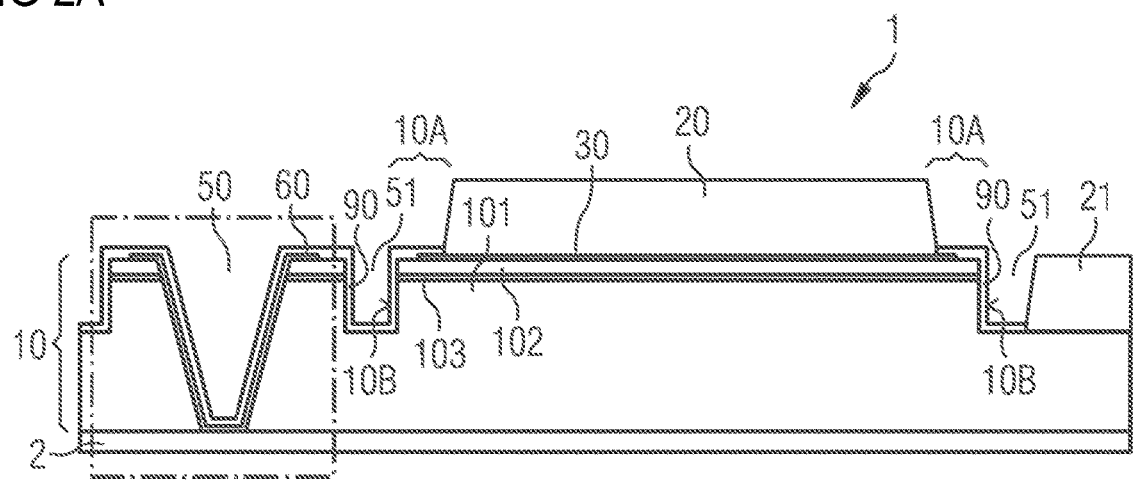
FIG. 2A is a schematic cross-section through an optoelectronic semiconductor device according to a second exemplary embodiment.

FIG. 2A shows a schematic cross-section of an optoelectronic semiconductor device 1 described herein, according to the second exemplary embodiment, which largely corresponds to the first exemplary embodiment. FIG. 2A shows a trench 50, introduced in the semiconductor body 10, and a recess 51. The recess 51 serves to structure the semiconductor body 10 and delimits the semiconductor body 10 in its main plane of extension by the side surfaces of the semiconductor body 10B. The trench 50 serves to interrupt the optoelectronic semiconductor device 1 and thus to reduce a waveguide effect occurring in the semiconductor body 10. This effectively reduces or even eliminates the coupling-out of electromagnetic radiation at the side surfaces of the optoelectronic semiconductor device 1.

Figure 2B:
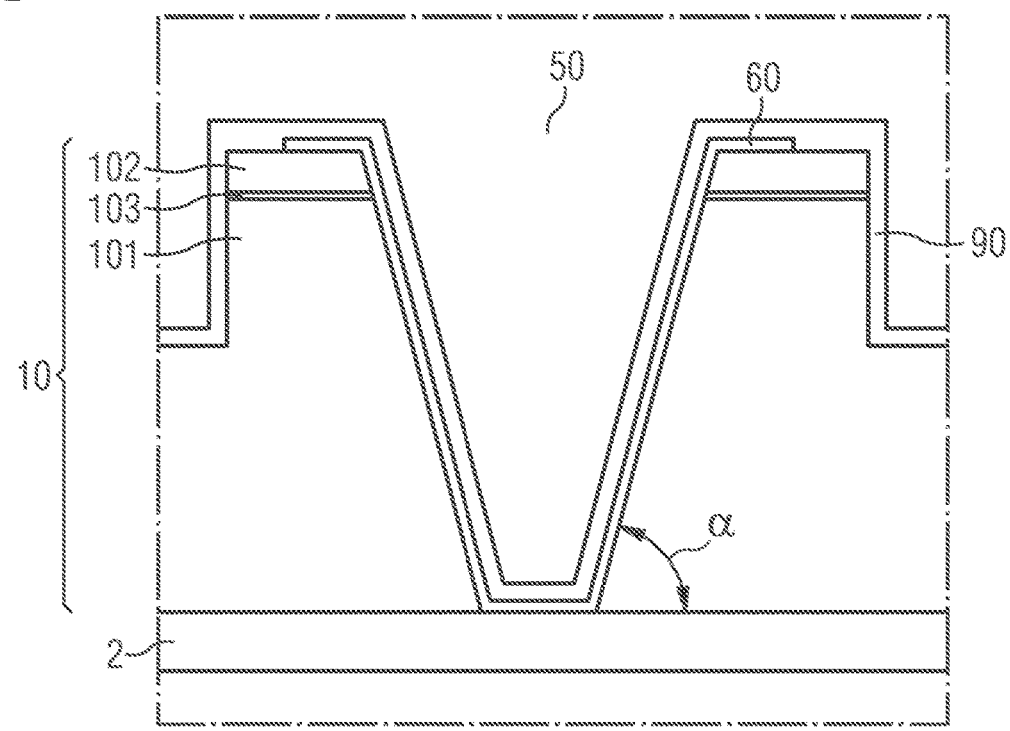
FIG. 2B is a section of a schematic cross-section of an optoelectronic semiconductor device according to the second exemplary embodiment.

FIG. 2B shows a section of a schematic cross-section of an optoelectronic semiconductor device 1 described herein, according to the second exemplary embodiment. The section corresponds to the region of the optoelectronic semiconductor device 1 marked in FIG. 2A with a dotted line. FIG. 2B shows the structure of the trench 50 in detail. The sides of the trench 50 are coated with a light-absorbing material 60. The light-absorbing material 60 reduces or prevents back reflection of incident electromagnetic radiation into the optoelectronic semiconductor device 1. The light-absorbing material 60 is, for example, a metal or polymer filled with light absorbing particles. The trench 50 completely penetrates the semiconductor body 10 in one direction along the stacking direction. The side flanks of the trench 50 enclose a flank angle $\alpha$ with the main extension plane of the semiconductor body 10, which is in particular less than 70°. The trench 50 is arranged along the edge of the semiconductor body 10, whereby the trench 50 can also be divided into several sections.

Figure 3:
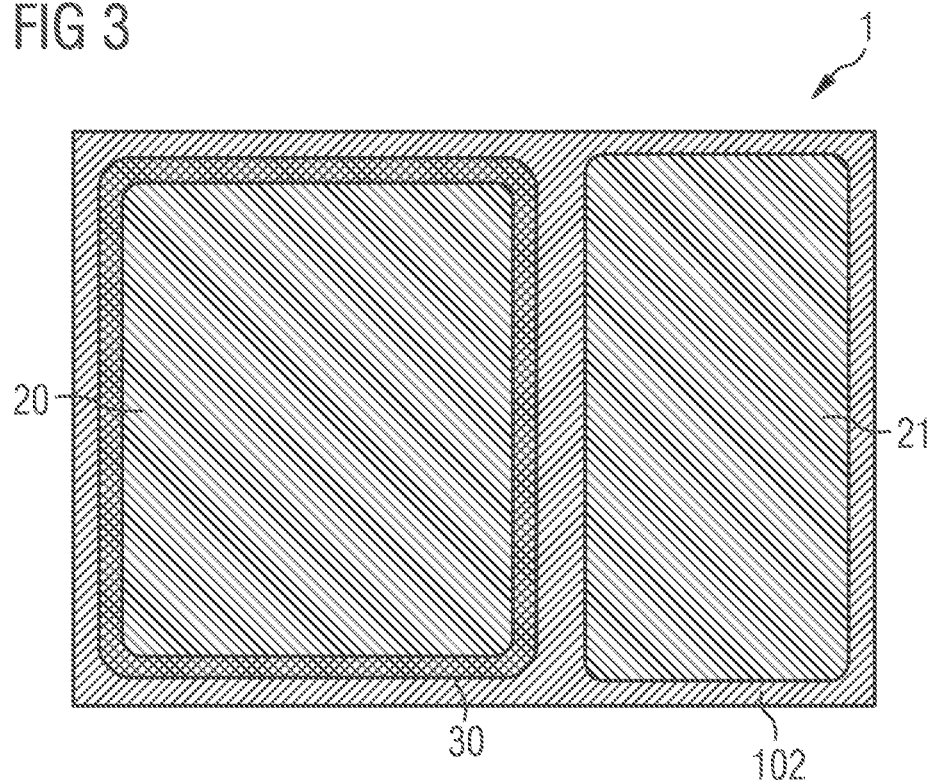
FIG. 3 is a schematic top view of an optoelectronic semiconductor device according to the first exemplary embodiment.

FIG. 3 shows a schematic top view of an optoelectronic semiconductor device 1 described herein, according to the first exemplary embodiment. Shown are the electrical contacts arranged laterally side by side in the form of the contact metallization 20 and the electrical connection layer 21. An absorber layer structure 30 is located on the edge surrounding the electrical contact metallization 20. The lateral projection of the absorber layer structure 30 beyond the contact metallization 20 influences the coupling-out efficiency of the optoelectronic semiconductor device 1. A larger projection of the absorber layer structure 30 reduces the coupling-out and thus the brightness of the optoelectronic semiconductor device 1.

Figure 4:
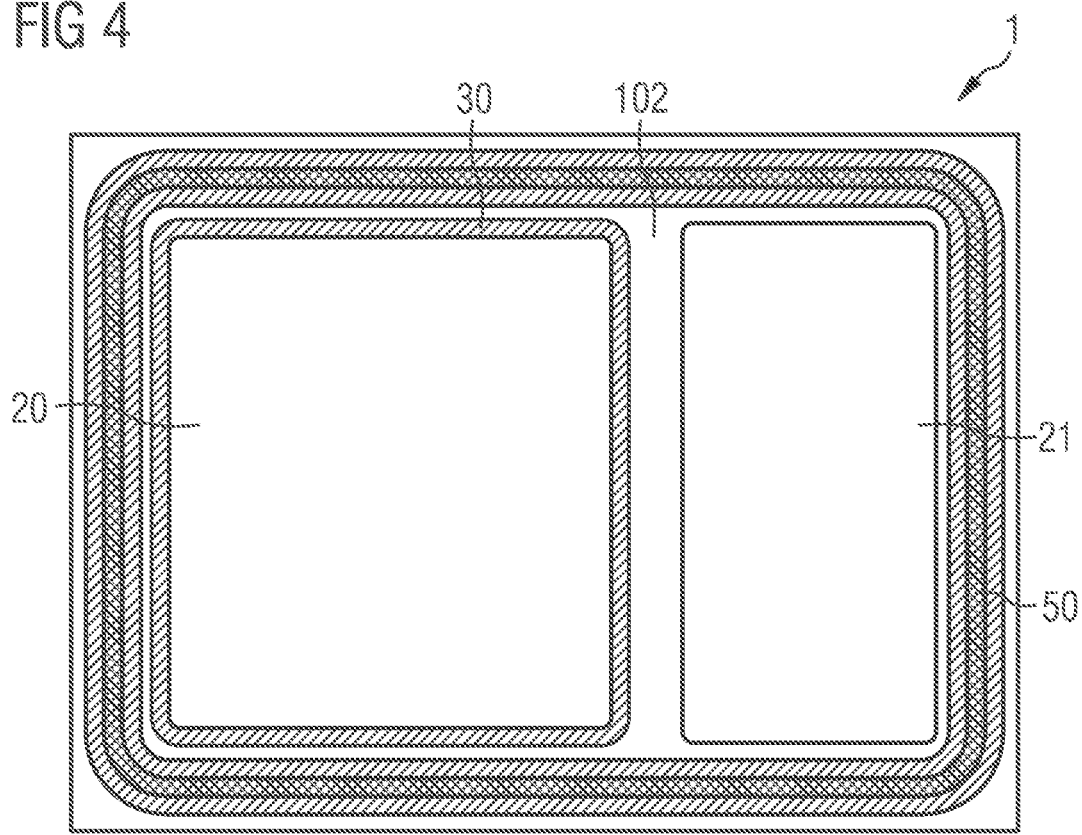
FIG. 4 is a schematic top view of an optoelectronic semiconductor device according to the second exemplary embodiment.

FIG. 4 shows a schematic top view of an optoelectronic semiconductor device 1 described here according to the second exemplary embodiment. Around the radiation coupling-out region 10A a trench 50 is formed, which is completely closed. The trench 50 thus essentially completely prevents the lateral coupling-out of electromagnetic radiation from the optoelectronic semiconductor device 1. A completely closed trench 50 is particularly effective as ESD protection. ESD protection protects the regions 101, 102 and 103 of the semiconductor body 10 against electrostatic discharges and the resulting excess voltages.

FIG. 5 shows a schematic top view of an optoelectronic semiconductor device 1 described herein, according to the third exemplary embodiment, which in essential elements corresponds to the first or second exemplary embodiment. In this exemplary embodiment, the trench 50 is divided into several sections. The total length of the trench 50, which consists of the length of the individual parts of the trench 50, is in a given ratio to the circumference of the radiation coupling-out region 10A.

Figure 6A:
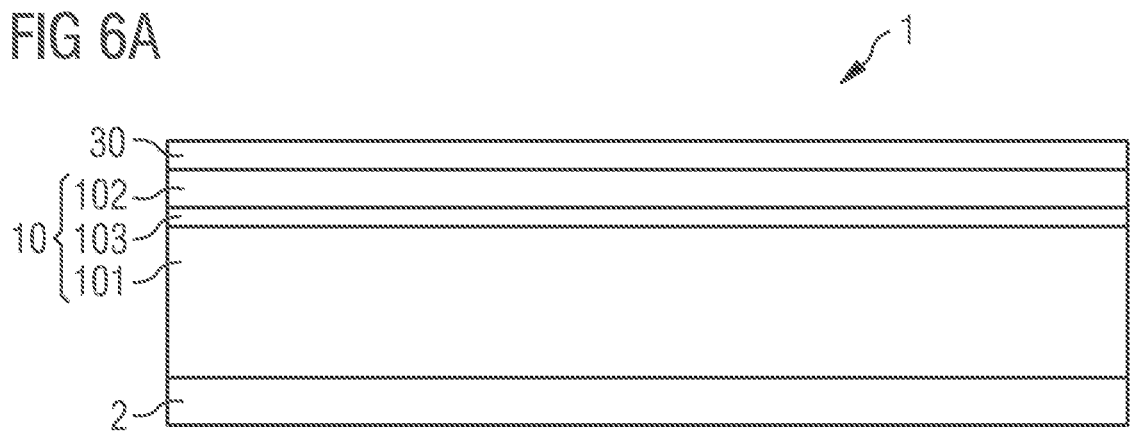
FIGS. 6A to 6F are schematic cross-sections through an optoelectronic semiconductor device according to the first exemplary embodiment in various stages of its production.

FIGS. 6A to 6F show schematic cross-sections through an optoelectronic semiconductor device described herein, according to the first exemplary embodiment in various stages of its production. FIG. 6A shows an optoelectronic semiconductor device 1 having a semiconductor body 10 comprising a first region 101, an active region 103 and a second region 102. The semiconductor body is epitaxially grown on a growth substrate 2. An absorber layer structure 30 is arranged on the side of the second region 102 facing away from the active region 103.

Figure 6B:
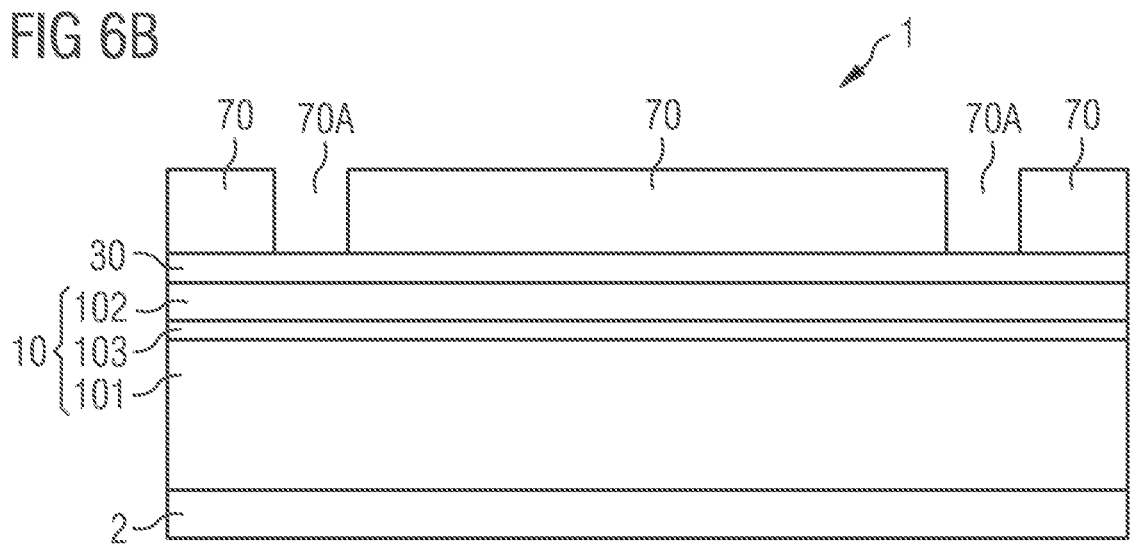

FIG. 6B shows the application of a first mask layer 70 to the side of the absorber layer structure 30 facing away from the semiconductor body 10, wherein the first mask layer 70 comprises a plurality of recesses 70A.

Figure 6C:
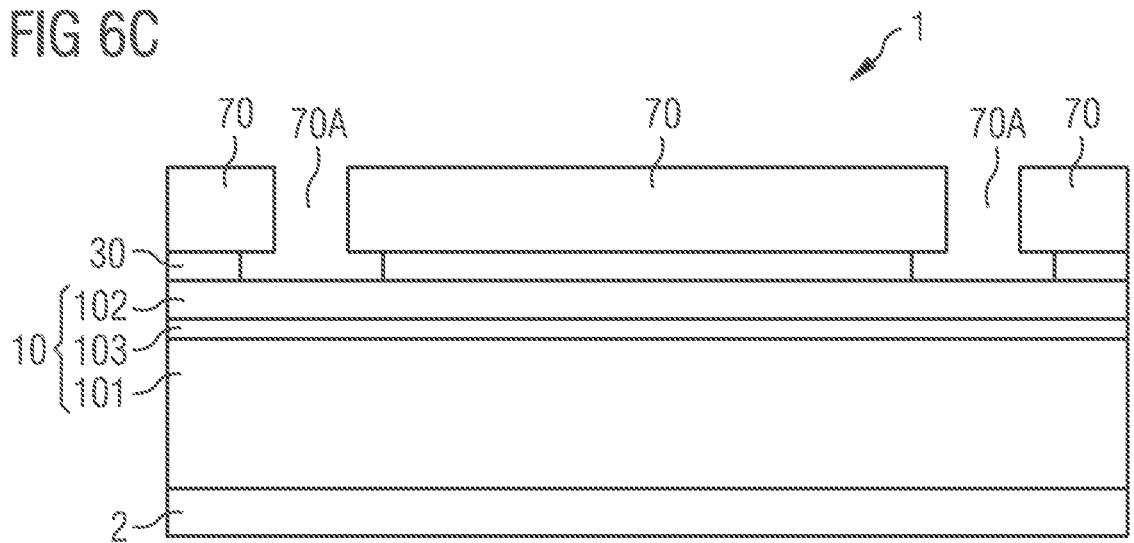

FIG. 6C shows an optoelectronic semiconductor device 1 in a further step of a method for its production. By means of a first etching process, the material of the absorber layer structure 30 is removed in the region of the plurality of recesses 70A, thus producing an undercut of the first mask layer 70. The first etching process is particularly a wet chemical etching process. The undercutting of the first mask layer 70 in the region of the absorber layer structure 30 leads to a defined retraction of the absorber layer structure 30 under the first mask layer 70.

Figure 6D:
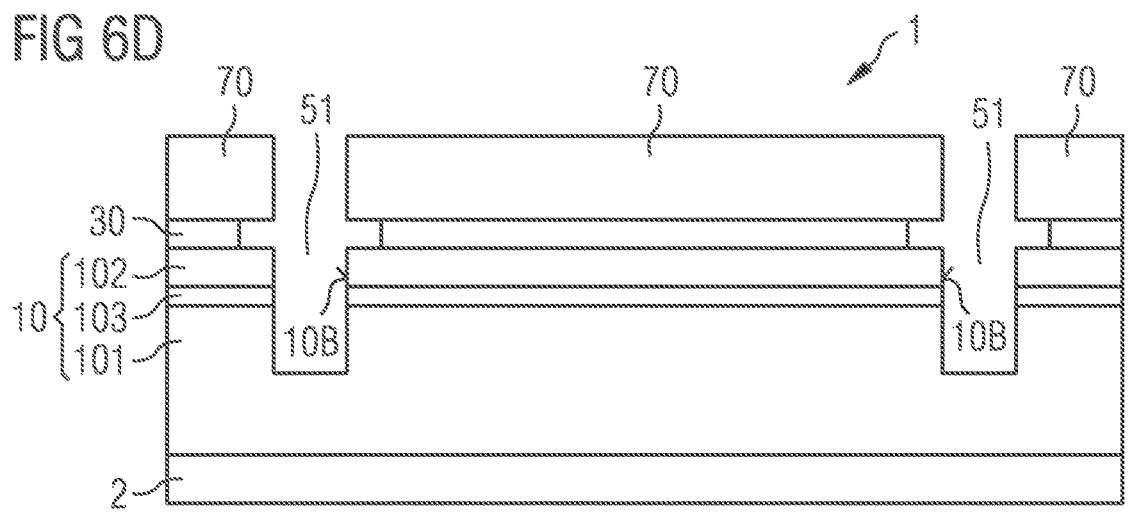

FIG. 6D shows a further step of a method for producing an optoelectronic semiconductor device 1. A plurality of recesses 51 is made in the semiconductor body 10 in the region of the plurality of recesses 70A. The recesses 51 are produced by means of a second etching process. The second etching process is in particular a dry chemical etching process, such as a plasma etching process. The recesses 51 create a mesa structure in the semiconductor body which is delimited by side surfaces 10B. By using the first mask layer 70 for both the first etching process and the second etching process, a self-aligned alignment of the absorber layer structure 30 to the position of the recesses 51 and the side surfaces of the semiconductor body 10B is achieved.

Figure 6E:
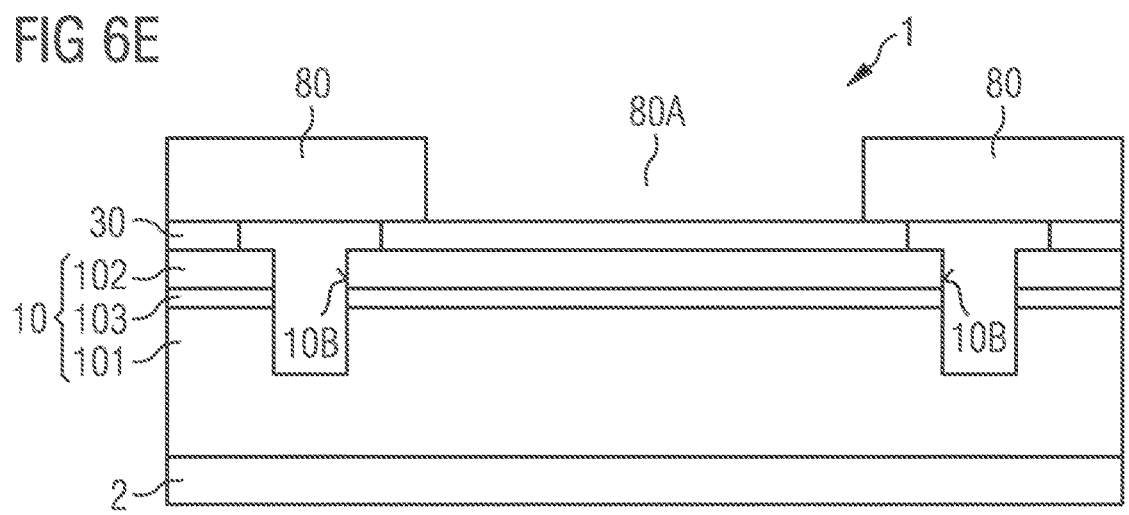

FIG. 6E shows an optoelectronic semiconductor device 1 in which the first mask layer 70 is completely removed and a second mask layer 80 is deposited on the side of the absorber layer structure 30 facing away from the semiconductor body 10. The second mask layer 80 comprises a recess 80A that completely overlaps with the absorber layer structure 30 in the direction of the main extension plane of the semiconductor body 10.

Figure 6F:
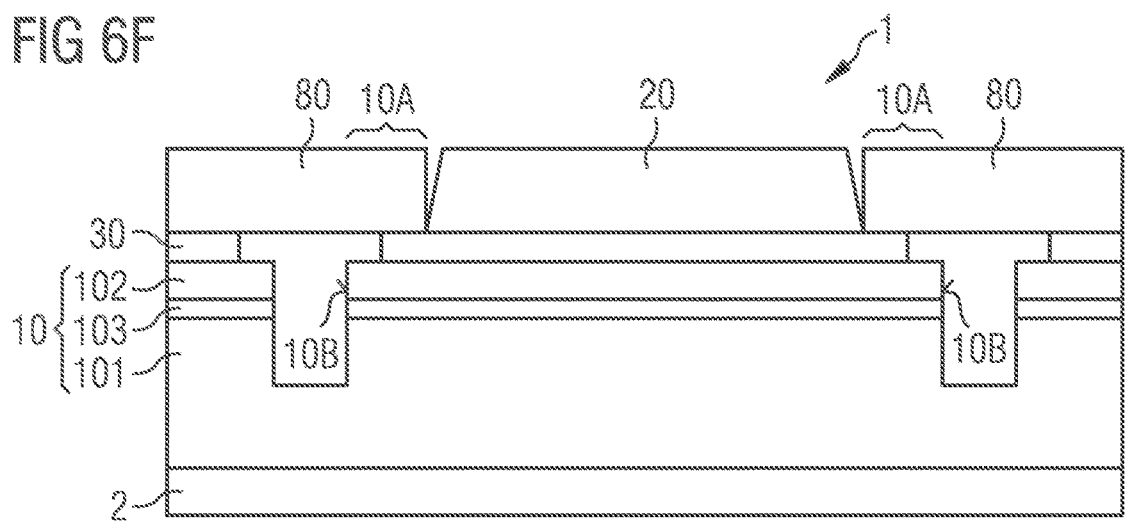

FIG. 6F shows an optoelectronic semiconductor device 1 in which the recess in the second mask layer 80A is filled with the electrical contact metallization 20. The optoelectronic semiconductor device 1 can thus be produced advantageously with only two different mask layers.

The invention is not limited by the description of the exemplary embodiments. Rather, the invention includes any new feature and any combination of features, which in particular includes any combination of features in the patent claims, even if that feature or combination itself is not explicitly mentioned in the patent claims or exemplary embodiments.

What is claimed is:

1. An optoelectronic semiconductor device comprising:
a semiconductor body comprising a first region of a first conductivity type, an active region configured to generate electromagnetic radiation and a second region of a second conductivity type in a stacking direction;
an electrical contact metallization arranged on a side of the second region facing away from the active region and being opaque to the electromagnetic radiation;
a radiation coupling-out region surrounding the electrical contact metallization at an edge side;
an absorber layer structure arranged between the electrical contact metallization and the second region; and
an adhesive layer arranged between the absorber layer structure and the electrical contact metallization,
wherein at least one layer of the absorber layer structure comprises gold, and
wherein at least one layer of the absorber layer structure comprises palladium and/or nickel.

2. The optoelectronic semiconductor device according to claim 1, wherein the layer comprising the gold has a thickness of at most 500 nm.

3. The optoelectronic semiconductor device according to claim 1, wherein the layer comprising the palladium and/or nickel has a thickness ranging from 0.5 nm to 100 nm.

4. The optoelectronic semiconductor device according to claim 1, wherein the semiconductor body is based on a nitride compound semiconductor material.

5. The optoelectronic semiconductor device according to claim 1, wherein the electrical contact metallization occupies an area portion of at least 20% of an area of the semiconductor body.

6. The optoelectronic semiconductor device according to claim 1, wherein a distance of the absorber layer structure to a side surface of the semiconductor body lies within a range of 0.1 μm to 15 μm.

7. The optoelectronic semiconductor device according to claim 1, wherein the semiconductor body comprises a trench formed in the second region, and wherein the trench at least partially surrounds the radiation coupling-out region.

8. The optoelectronic semiconductor device according to claim 7, wherein the trench penetrates at least half of the semiconductor body in the stacking direction.

9. The optoelectronic semiconductor device according to claim 7, wherein the trench completely penetrates the semiconductor body in the stacking direction.

10. The optoelectronic semiconductor device according to claim 7, wherein the trench is at least partially filled with a light-absorbing material.

11. The optoelectronic semiconductor device according to claim 7, wherein the trench comprises a plurality of sections.

12. The optoelectronic semiconductor device according to claim 7, wherein a length of the trench comprises at least 10% of a circumference of the radiation coupling-out region.

13. The optoelectronic semiconductor device according to claim 7, wherein the trench has side flanks including a flank angle of less than 70° with a major extension plane of the semiconductor body.

* * * * *